(12) United States Patent
Clark

(10) Patent No.: US 8,003,503 B1
(45) Date of Patent: Aug. 23, 2011

(54) METHOD OF INTEGRATING STRESS INTO A GATE STACK

(75) Inventor: Robert D Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/895,696

(22) Filed: Sep. 30, 2010

(51) Int. Cl.
*H01L 21/265* (2006.01)

(52) U.S. Cl. ............ 438/520; 438/522; 257/E29.158; 257/E29.16

(58) Field of Classification Search ........... 438/164, 438/176, 212, 283, 520, 522, 585; 257/368, 257/E29.158, E29.16
See application file for complete search history.

(56) References Cited

U.S. PATENT DOCUMENTS

| 7,164,163 | B2 | 1/2007 | Chen et al. |
| 7,226,826 | B2 | 6/2007 | Alshareef et al. |
| 7,393,761 | B2 | 7/2008 | Wajda et al. |
| 7,425,497 | B2 | 9/2008 | Chudzik et al. |
| 2008/0105910 | A1 | 5/2008 | Matsuki |
| 2009/0134466 | A1* | 5/2009 | Cho et al. ............ 257/368 |

* cited by examiner

*Primary Examiner* — Hsien-ming Lee

(57) ABSTRACT

A method of forming a semiconductor device includes providing a dielectric film on a substrate, depositing a metal-containing gate electrode film over the dielectric film, and modifying a surface layer of the metal-containing gate electrode film by exposing the metal-containing gate electrode film to a process gas containing an oxygen-containing gas, a nitrogen-containing gas, or an oxygen- and nitrogen-containing gas, where a thickness of the modified surface layer is less than a thickness of the metal-containing gate electrode film. The method further includes, heat-treating the modified metal-containing gate electrode film to form a stressed metal-containing gate electrode film that exhibits stress over the substrate.

25 Claims, 7 Drawing Sheets

US 8,003,503 B1

METHOD OF INTEGRATING STRESS INTO A GATE STACK

FIELD OF THE INVENTION

The present invention generally relates to manufacturing of semiconductor devices, and more particularly to a method of imparting stress into a gate stack.

BACKGROUND OF THE INVENTION

The scaling of very large scale integration (VLSI) circuits is an ongoing effort. With circuits becoming smaller and smaller, device driving current becomes more important. Device current is closely related to gate length, gate capacitance, and carrier mobility. Shortening poly-gate length, increasing gate capacitance, and increasing carrier mobility can improve the device's current performance. Gate length reduction is an effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain, also referred to as stress, can enhance bulk electron and hole mobility. The performance of a metal-oxide-semiconductor (MOS) device can be enhanced through a strained-surface channel. This technique allows performance to be improved at a constant gate length, without adding complexity to circuit fabrication or design.

When silicon (Si) is placed under strain, the in-plane, room temperature electron mobility is dramatically increased. One way to develop strain is by using a graded SiGe epitaxy layer as a substrate on which a layer of relaxed SiGe is formed. A layer of Si is formed on the relaxed Si layer. MOS devices are then formed on the silicon layer, which has inherent strain. Since the lattice constant of SiGe is greater than that of Si, the Si film is under biaxial tension and thus the carriers exhibit strain-enhanced mobility.

Strain in a device may have components in three directions; parallel to the MOS device channel length, parallel to the device channel width, and perpendicular to the channel plane. The strains parallel to the device channel length and width are called in-plane strains. Research has revealed that bi-axial, in-plane tensile strain field can improve nMOS performance, and compressive strain parallel to channel length direction can improve pMOS device performance.

Strain can also be applied by forming a strained topside or passivation film of a dielectric material (e.g., silicon nitride film) over underlying layers containing the integrated structure, such as a MOS device. This film, in addition to functioning as an insulation film, acts to protect the underlying structure from moisture and ion contamination that can damage or destroy the structure by causing corrosion and electrical shorts. When a passivation film is deposited on a MOS device, due to the lattice spacing mismatch between the passivation film and the underlying MOS device, an in-plane strain develops to match the lattice spacing. However, what is needed is a method to impose strain more proximate the channel region, thus increasing the imparted strain, without adding much complexity into the manufacturing process.

SUMMARY OF THE INVENTION

Embodiments of the invention describe a method for forming a stressed gate stack over a substrate for a semiconductor device. The stressed gate stack contains a thin modified surface layer formed by modifying a surface layer of a metal-containing gate electrode film on a dielectric film. According to embodiments of the invention, the modifying process is performed using low-energy excited oxygen species, low-energy nitrogen species, or low-energy excited oxygen and nitrogen species that enable the formation of the thin modified surface layer and eliminate oxidation and/or damage to underlying materials and devices.

In one embodiment, the method includes depositing a dielectric film on a substrate, depositing a metal-containing gate electrode film over the dielectric film, and modifying a surface layer of the metal-containing gate electrode film by exposing the metal-containing gate electrode film to a process gas containing an oxygen-containing gas, a nitrogen-containing gas, or an oxygen- and nitrogen-containing gas, where a thickness of the modified surface layer is less than the thickness of the metal-containing gate electrode film. The method further includes, following the modifying, heat-treating the metal-containing gate electrode film to form a stressed metal-containing gate electrode film that exhibits compressive or tensile stress over the substrate. The modifying can include using a slot plane antenna (SPA) plasma source to form low-energy excited oxygen species, nitrogen species, or oxygen and nitrogen species from the process gas in a plasma, and exposing the metal-containing gate electrode film to the excited species to incorporate oxygen, nitrogen, or oxygen and nitrogen, into the surface layer of the metal-containing gate electrode film. Alternately, or in addition, the modifying can include using non-ionizing electromagnetic (EM) radiation to form oxygen radicals, nitrogen radicals, or oxygen and nitrogen radicals, from the process gas, and exposing the metal-containing gate electrode film to the oxygen radicals, nitrogen radicals, or the oxygen and nitrogen radicals, to incorporate oxygen, nitrogen, or oxygen and nitrogen, into the surface layer of the metal-containing gate electrode film.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
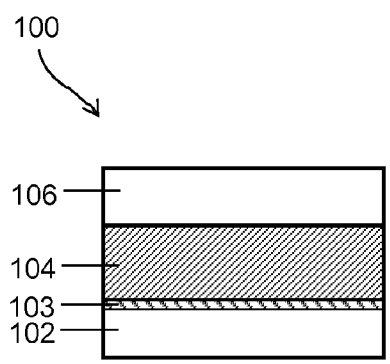
FIGS. 1A-1E are schematic cross-sectional views of a method for forming a stressed gate stack on a substrate according to an embodiment of the invention.

Methods for forming a stressed gate stack in semiconductor processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrase "in one embodiment" in various places throughout this specification are not necessarily referring to the same embodiment of the invention.

There is a general need for new methods for forming stressed gate stacks under well-controlled process conditions that provide great flexibility for tailoring the material properties and the stress induced in the films that improve device performance. In particular, there is a general need for imposing stress more proximate the channel region of a gate stack, thus increasing the imparted stress, without adding much complexity into the manufacturing process. The new methods should replace ion implantation methods that utilize high kinetic energy ion beams and methods that utilize direct exposure of the films to very high kinetic energy oxygen (O) species and nitrogen (N) species such as O and N ions excited by conventional plasma processing systems and plasma processing conditions. These methods to be replaced have several drawbacks, including charging damage of the exposed films and poor control over the depth profiles of elements embedded in the films. These drawbacks become increasingly more important as films in semiconductor devices become increasingly thinner.

Embodiments of the invention integrate deposition of a metal-containing gate electrode film and in-situ (without air exposure) oxidation and/or nitridation of the metal-containing gate electrode film by low-energy oxygen (O) and/or nitrogen (N) species in a process gas. The process gas may contain an oxygen-containing gas (e.g., $O_2$, $H_2O$, or $H_2O_2$) and low-energy O species, a nitrogen-containing gas (e.g., $N_2$, $NH_3$, $N_2H_4$, or $N_2H_6$) and low-energy N species, or an oxygen- and nitrogen-containing gas (e.g., NO, $N_2O$, or $NO_2$). In some embodiments the process gas may contain an oxygen-containing gas, a nitrogen-containing gas, low-energy O species, and low-energy N species. The low-energy O species, low-energy N species, or low-energy O and N species, modify only a top surface layer of the metal-containing gate electrode film where a thickness of the modified surface layer is less than the total thickness of the metal-containing gate electrode film, or less than half of total thickness of the metal-containing gate electrode film. The presence of the modified surface layer on the metal-containing gate electrode film imparts stress into the resulting gate stack due to lattice mismatch between the modified surface layer and the remaining un-modified portion of the metal-containing gate electrode film.

The use of low-energy O species, low-energy N species, or low-energy O and N species eliminates oxidation and/or damage to underlying materials and devices and the small thickness of the modified surface layer relative the total thickness of the metal-containing gate electrode film does not significantly change the effective work function of a resulting gate stack containing the modified surface layer. In some examples the change in the effective work function by the modification of the surface layer is less than 0.5 eV, less than 0.4 eV, less than 0.3 eV, less than 0.2 eV, or even less than 0.1 eV. The effective (measured) work function of gate stacks are a function of the bulk properties of the films in the gate stacks and the material properties of the interfaces between the films. The in-situ processing provides excellent control over the extent of film modification and modification depth profile, and reduces contamination due to the absence of atmospheric exposure during the processing.

FIGS. 1A-1E are schematic cross-sectional views of a method for forming a stressed gate stack on a substrate according to an embodiment of the invention.

FIG. 1A schematically shows a cross-sectional view of a film structure 100 containing a substrate 102, an interface layer 103, a dielectric film 104 on the interface layer 103, and a metal-containing gate electrode film 106 on the dielectric film 104. The substrate 102 can be of any size, for example a 200 mm substrate, a 300 mm substrate, or an even larger substrate. According to one embodiment, the substrate 102 can contain Si, for example crystalline Si, polycrystalline Si, or amorphous Si. In one example, the substrate 102 can contain a tensile-strained Si layer. According to another embodiment, the substrate 102 may contain Ge or $Si_xGe_{1-x}$ compounds, where x is the atomic fraction of Si, 1-x is the atomic fraction of Ge, and 0<(1-x)<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 102 can be a compressive-strained Ge layer or a tensile-strained $Si_xGe_{1-x}$ (x>0.5) deposited on a relaxed $Si_{0.5}Ge_{0.5}$ buffer layer. According to another embodiment, the substrate 102 may contain Ga and As compounds (GaAs) or In, Ga and As compounds (InGaAs).

The interface layer 103 can contain silicon oxide (e.g., $SiO_x$, where x is equal to or less than 2), silicon nitride, silicon oxynitride, or a combination thereof. Integrated circuits containing a Si substrate commonly employ $SiO_2$ and/or $SiO_xN_y$ substrate interface layers that can have excellent electrical properties, including high electron mobility and low electron trap densities. The interface layer 103 can contain aluminum oxide ($Al_2O_3$), or another high-k layer (e.g. $TiO_2$ or $HfO_2$) or a combination thereof. Integrated circuits containing a Ge, SiGe, GaAs, or InGaAs substrate commonly employ SiN, $Al_2O_3$ or other interface layers that can have excellent electrical properties, including high electron mobility and low electron trap densities. The interface layer 103 can have a thickness between about 2 angstrom and about 15 angstrom, between about 3 angstrom and about 8 angstrom, for example about 6 angstrom. The interface layer may be formed on a clean substrate 102.

The dielectric film 104 can contain $SiO_2$ or a high-k material such as SiON, an alkaline earth element, titanium, hafnium, zirconium, or a rare earth element, or any combination of two or more thereof. According to some embodiments, a high-k dielectric film 104 may contain an element selected from the Periodic Table of the Elements that is capable of forming a high-k dielectric film, for example an oxide film, a nitride film, or an oxynitride film. In one example, the element capable of forming a high-k dielectric film 104 may react with the interface layer 103 described above and form a high-k dielectric film 104. The high-k dielectric film 104 may be, for example, deposited by chemical vapor deposition (CVD), atomic layer deposition (ALD), plasma-enhanced CVD (PECVD), or plasma-enhanced ALD (PEALD). According to one embodiment of the invention, ALD or PEALD methods may be utilized due to normally superior uniformity and atomic level thickness control compared to CVD and PECVD methods. A thickness of the dielectric film 104 can be, for example, between 5 angstrom and 50 angstrom, between 5 angstrom and 30 angstrom, or between 5 angstrom and 20 angstrom. In some examples, the dielectric film 104 can, for example, contain high-k metal oxides and their silicates, including $Ta_2O_5$, $TiO_2$, $ZrO_2$, $Al_2O_3$, $HfSiO_x$, $HfO_2$, $ZrO_2$, $ZrSiOx$, $TaSiO_x$, $SrO_x$, $SrSiO_x$, $YO_x$, or $YSiO_x$, or combinations of two or more thereof.

According to one embodiment, the high-k dielectric film 104 can include an oxide, nitride, oxynitride, or silicate film containing one or more rare earth elements, including yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb). Examples of rare earth oxide high-k dielectric films include yttrium oxide ($Y_2O_3$), lanthanum oxide ($La_2O_3$), lutetium oxide ($Lu_2O_3$), and lanthanum lutetium oxide ($LaLuO_3$).

FIG. 1A further shows a metal-containing gate electrode film 106 deposited on the dielectric film 104. The metal-containing gate electrode film 106 can, for example, have a thickness between 20 angstrom and 1000 angstrom, between 20 angstrom and 200 angstrom, or between 40 angstrom and 100 angstrom. The metal-containing gate electrode film 106 can contain or consist of metals and metal-containing materials, including W, WN, Al, Mo, Ta, TaN, TaC, TaSiN, TaAlN, HfN, HfSiN, Ti, TiN, TiSiN, TiAlN, Mo, MoN, Re, or Ru.

Figure 1B:
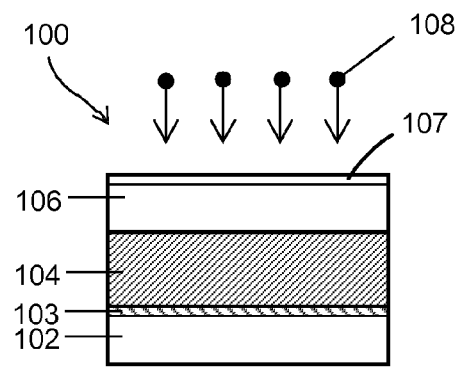

In FIG. 1B, a surface layer 107 of the metal-containing gate electrode film 106 is exposed to a process gas 108 containing or comprising an oxygen-containing gas, a nitrogen-containing gas, or an oxygen- and nitrogen-containing gas, to modify the surface layer 107. The exposure incorporates oxygen, nitrogen, or oxygen and nitrogen, into the surface layer 107. The oxygen-containing gas can comprise or consist of a non-metal-containing gas, for example $O_2$, $H_2O$, or $H_2O_2$, or a combination thereof. The nitrogen-containing gas can comprise or consist of a non-metal-containing gas, for example $N_2$, $NH_3$, $N_2H_4$, or $N_2H_6$, or a combination thereof. The oxygen- and nitrogen-containing gas can comprise or consist of a non-metal-containing gas, for example NO, $N_2O$, or $NO_2$, or a combination thereof.

According to one embodiment, the process gas 108 contains oxygen radicals, nitrogen radicals, or oxygen radicals and nitrogen radicals, that may be formed by irradiating the process gas 108 with non-ionizing electromagnetic (EM) radiation, and the surface layer 107 modified by exposing the metal-containing gate electrode film 106 to the oxygen radicals, nitrogen radicals, or the oxygen radicals and nitrogen radicals, where the modifying incorporates oxygen, nitrogen, or oxygen and nitrogen, into the surface layer 107. The modifying process parameters can be selected such that a desired amount of the modifying species is incorporated into the surface layer 107 and so that the penetration depth of the modifying species is limited to a desired depth of the metal-containing gate electrode film 106. For example, modifying process parameters can include concentration of the oxygen-containing gas, the nitrogen-containing gas, or the oxygen- and nitrogen-containing gas in the process gas, concentration of the oxygen radicals, the nitrogen radicals, or the oxygen and nitrogen radicals, process gas exposure time, and gas pressure. Exemplary exposure times can be between 30 seconds and 300 seconds, or between 60 seconds and 120 seconds. Exemplary gas pressures can between 100 mTorr and 100 Torr, between 100 mTorr and 10 Torr, or between 10 Torr and 100 Torr.

According to another embodiment, the process gas 108 can contain plasma-excited low-kinetic energy oxidation or nitridation species (radicals, ions, or both) of oxygen, nitrogen, or oxygen and nitrogen, formed by a slot plane antenna (SPA) plasma source. The surface layer 107 is modified by exposing the metal-containing gate electrode film 106 to the plasma-excited low-kinetic energy oxidation or nitridation species, where the modifying incorporates oxygen, nitrogen, or oxygen and nitrogen, into the surface layer 107. The plasma conditions and exposure times can be selected such that a desired amount of the modifying species is incorporated into the surface layer 107. Plasma condition parameters can include concentration of the excited modifying species and the kinetic energy of the excited modifying ions when they interact with the surface layer 107. The kinetic energy may be selected to control the penetration depth of oxygen, nitrogen, or oxygen and nitrogen. The kinetic energy may be selected through biasing of the substrate 102. According to an embodiment of the invention, the kinetic energy of the excited oxidation or nitridation species can be less that 1000 eV. According to some embodiments, the kinetic energy can be less than 100 eV, less than 50 eV, less than 10 eV, or less than 2 eV. Modifying process parameters can include concentration of the oxygen-containing gas, the nitrogen-containing gas, or the oxygen- and nitrogen-containing gas, exposure time, and gas pressure. Exemplary exposure times can be between 30 seconds and 300 seconds, or between 60 seconds and 120 seconds. Exemplary total gas pressure can between 10 mTorr and about 10 Torr, for example about 100 mTorr. Alternatively, the gas pressure can be maintained between about 20 mTorr and about 1 Torr.

According to another embodiment, the process gas 108 can contain thermal (i.e., non-plasma excited or non-EM excited) oxygen-containing gas, thermal nitrogen-containing gas, or thermal oxygen- and nitrogen-containing gas. The surface layer 107 may be modified by exposing the metal-containing gate electrode film 106 to the process gas 108 to incorporate oxygen, nitrogen, or oxygen and nitrogen, into the surface layer 107 while maintaining the substrate at a temperature between 100° C. and 600° C., between 200° C. and 600° C., between 100° C. and 400° C., or between 300° C. and 400° C. The modifying conditions and exposure times can be selected such that a desired amount of the oxidation species is incorporated into the surface layer 107. Modifying process parameters can include concentration of the oxygen-containing gas, the nitrogen-containing gas, or the oxygen- and nitrogen-containing gas, exposure time, and total gas pressure. Exemplary exposure times can be between 30 seconds and 300 seconds, or between 60 seconds and 120 seconds. Exemplary gas pressure can between 100 mTorr and 100 Torr, between 100 mTorr and 10 Torr, or between 10 Torr and 100 Torr.

Figure 1C:
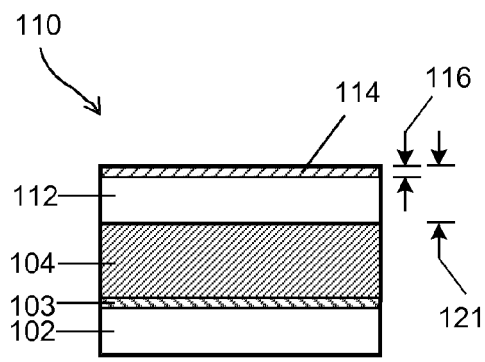

FIG. 1C shows a film structure 110 containing a metal-containing gate electrode film 112 having modified surface layer 114 with a thickness 116. The thickness 116 can be, for example, between 10 and 100 angstrom, between 10 and 50 angstrom, between 30 and 100 angstrom, between 30 and 50 angstrom, or between 20 and 30 angstrom. In some embodiments the thickness 116 can be less than 50%, less than 40%, less than 30%, less than 20%, or even less than 10% of the total thickness 121 of the metal-containing gate electrode film 112 and the modified surface layer 114.

Figure 1D:
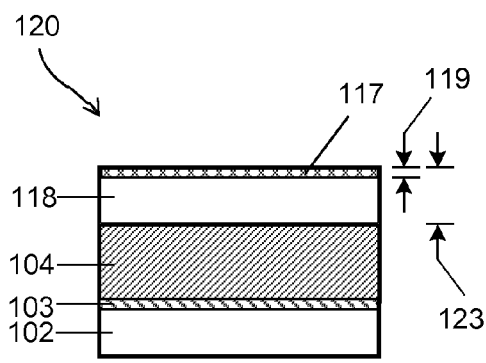

Embodiments of the invention further include a heat-treating step for heat-treating the film structure 110 during, following, or both during and following the exposure to the process gas 108. The heat-treating step can be performed to further adjust the desired modifying depth profile (oxygen, nitrogen, or oxygen and nitrogen, concentration of oxygen, nitrogen, or oxygen and nitrogen, as a function of depth in the modified surface layer 114) in the film structure 110, and stress modulation caused by the modified surface layer 114 in the film structure 110. According to one embodiment, the heat-treating may be performed at a higher substrate temperature than the modifying step. The heat-treating can be performed by maintaining the film structure at a temperature between 100° C. and 600° C., between 100° C. and 400° C., between 200° C. and 600° C., or between 400° C. and 600° C., for example. FIG. 1D shows a heat-treated film structure 120 containing a modified surface layer 117 with a thickness 119. The thickness 119 can be greater than the thickness 116 due to diffusion of oxygen, diffusion of nitrogen, or diffusion of oxygen and nitrogen, from the modified surface layer 114 into a top portion of the metal-containing gate electrode film 112 below the modified surface layer 114. The thickness 119 can be, for example, between 10 and 100 angstrom, between 10 and 50 angstrom, between 30 and 100 angstrom, or between 30 and 50 angstrom or between 20 and 30 angstrom. In some embodiments the thickness 119 can be less than 50%, less than 40%, less than 30%, less than 20%, or even less than 10% of the total thickness 123 of the metal-containing gate electrode film 118 and the modified surface layer 117.

Figure 1E:
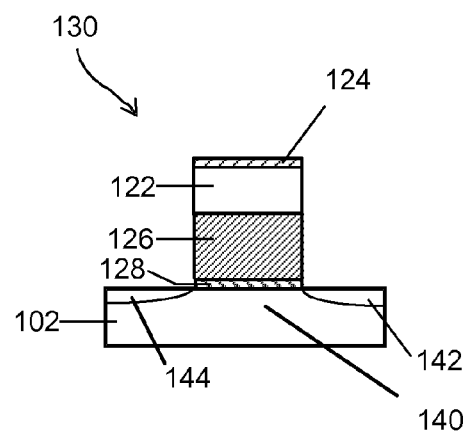

FIG. 1E shows a stressed gate stack 130 following patterning of the heat-treated gate structure 120 in FIG. 1D. The patterning may be performed using standard lithography and dry etching techniques known to those skilled in the art. The stressed gate stack 130 contains a patterned modified surface layer 124 that exhibits compressive stress over channel region 140, a patterned metal-containing gate electrode film 122, a patterned high-k dielectric film 126, a patterned interface layer 128, and source and drain regions 142 and 144.

The cross-sectional views of a method for forming a stressed gate stack on a substrate depicted in FIGS. 1A-1E are an example of a gate first process flow where the dielectric film and the metal-containing gate electrode film form the gate stack before source and drain implantation and subsequent annealing. Embodiments of the invention may also be applied to a gate replacement process flow (also commonly referred to as a gate last process flow) for forming a transistor where a thin protective interfacial layer of a metal-containing gate electrode film is optionally deposited on top of the dielectric film, followed by formation of a temporary poly silicon gate on the dielectric film. The next steps are forming the source and drain, salicidation, and depositing the contact etch stop and first interlayer dielectric. Then the poly silicon gate is removed and more metal-containing gate electrode material is added on top of the interfacial layer to complete the metal-containing gate electrode. According to some embodiments of the invention, thereafter, a surface layer of the replacement metal-containing gate electrode may be exposed to a process gas containing or comprising an oxygen-containing gas, a nitrogen-containing gas, or an oxygen- and nitrogen-containing gas, to modify the surface layer of the metal-containing gate electrode. The exposure incorporates oxygen, nitrogen, or oxygen and nitrogen, into the surface layer of the replacement metal-containing gate electrode.

Figure 8A:
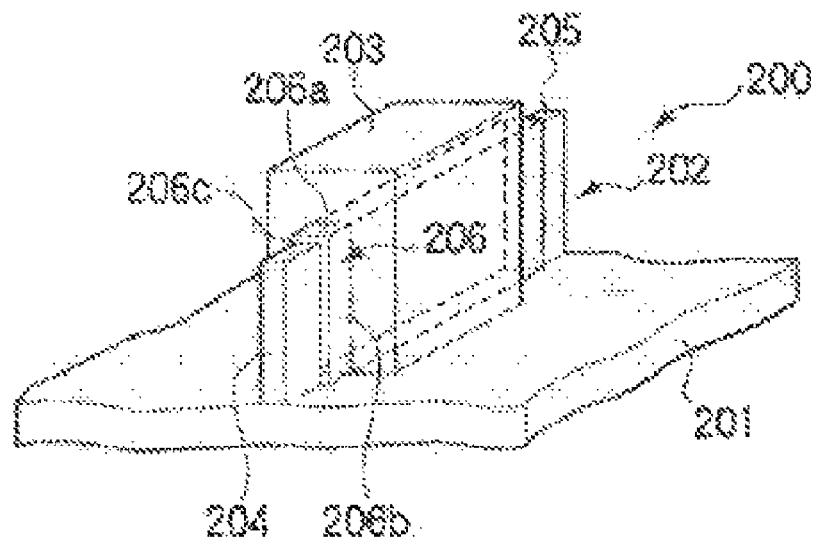
FIG. 8A is a perspective view showing the external appearance of a three-dimensional MOSFET.

Embodiments of the invention may be applied to fabrication of transistors having three-dimensional structures, such as a fin structure and a double gate structure. Such transistors having three-dimensional structures are being considered as alternatives to conventional planar MOS transistors, along with miniaturization of design rules due to an increase in the integration level and operation speed of LSI (Large Scale Integration) devices. FIG. 8A is a perspective view showing the external appearance of a three-dimensional MOSFET having a fin structure, as an example of a three-dimensional device. The MOSFET 200 has a symmetric three gate structure where the gate overlaps the two sides and the top of fin. The fin structure includes a silicon wall 202 formed on an underlying film 201, such as a $SiO_2$ film, and having a fin shape or raised feature. The three-dimensional structure is formed such that the silicon wall 202 is partly covered with a gate insulating film 206, and a gate electrode 203 is further formed on the gate insulating film 206. The gate insulating film 206 formed on the surface of the silicon wall 202 is covered with the gate electrode 203 on three sides, i.e., the top portion 206a and opposite wall surface portions 206b and 206c, thereby forming a transistor having a three-gate structure. The opposite extending portions of the silicon wall 202 with the gate electrode 203 interposed there between serve as a source 204 and a drain 205, and the transistor is arranged such that an electric current flows between the source and drain. Since the three-gate structure can control the channel region of the MOSFET 200 by use of the three gates, it provides a better performance in preventing a short channel effect and is well suited for miniaturization and integration for the 32-nm node generation or smaller, compared to the conventional planar MOSFETs that control the channel region using a single gate.

Figure 8B:
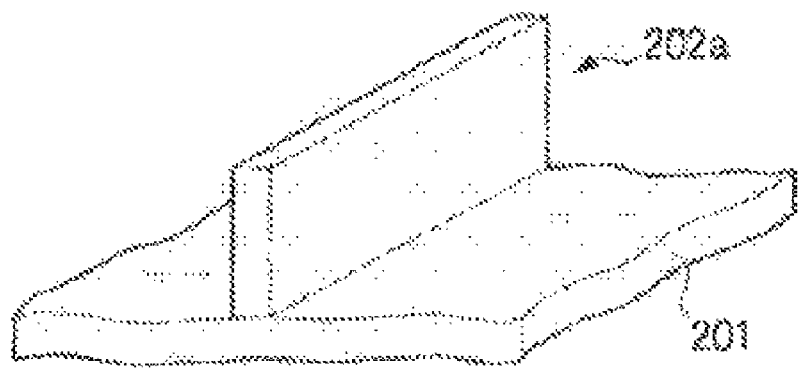
FIG. 8B is a perspective view showing the fin structure of the three-dimensional MOSFET.

FIG. 8B is a perspective view showing the fin structure of the three dimensional MOSFET 200 in FIG. 8A. The MOSFET 200 structure may be manufactured as follows. For example, a silicon layer is formed (e.g., by CVD) on an underlying film 201, such as an $SiO_2$ film, and then etching is performed using a mask that has a pattern formed thereon by a photolithography technique, to form a silicon wall 202a. Although FIG. 8B shows only one silicon wall 202a, a plurality of parallel silicon walls 202a may be used to form a semiconductor device.

Thereafter, the silicon wall 202a may be further trimmed by surface oxidation and oxide film removal to form a silicon wall 202 having a predetermined line width. Then, a gate insulating film 206 (e.g., a silicon oxide film) may be formed by using a self-limiting surface oxidation process using an oxidizing atmosphere on the surface of the silicon wall 202 with the desired line width pattern formed thereon. Alternately, an oxidation process, nitridation process, or oxynitridation process may be performed on the surface of the silicon wall 202, for example, to form a silicon oxide film ($SiO_2$ film), a silicon nitridation film (SiN), or a silicon oxynitridation film (SiON film). The oxidation process, nitridation process, or oxynitridation process may be performed by use of a plasma processing apparatus, for example using a capacitively coupled plasma (CCP), an inductively coupled plasma (ICP), a surface reflection wave plasma, or a magnetron plasma. Alternately, the gate insulating film 206 may be a high-k dielectric film containing metal oxides or their silicates, including $Ta_2O_5$, $TiO_2$, $ZrO_2$, $Al_2O_3$, $HfSiO_x$, $HfO_2$, $ZrO_2$, $ZrSiOx$, $TaSiO_x$, $SrO_x$, $SrSiO_x$, $YO_x$, or $YSiO_x$, or combinations of two or more thereof.

Then, a gate electrode 203 is formed by, e.g., CVD or ALD, to cover the gate insulating film 206 on the silicon wall 202, and etching is performed using a mask that has a pattern formed thereon by a photolithography technique, to form the gate electrode 203, thereby completing the MOSFET 200. The gate electrode 203 may contain or consist of metals and metal-containing materials, including W, WN, Al, Mo, Ta, TaN, TaC, TaSiN, TaAlN, HfN, HfSiN, Ti, TiN, TiSiN, TiAlN, Mo, MoN, Re, or Ru, or combinations of two or more thereof. According to embodiments of the invention, thereafter, a surface layer of the gate electrode 203 may be exposed to a process gas containing or comprising an oxygen-containing gas, a nitrogen-containing gas, or an oxygen- and nitrogen-containing gas, to modify the surface layer of the gate electrode 203. The exposure incorporates oxygen, nitrogen, or oxygen and nitrogen, into the surface layer of the gate electrode 203, thereby imparting stress into the MOSFET 200.

Figure 3:
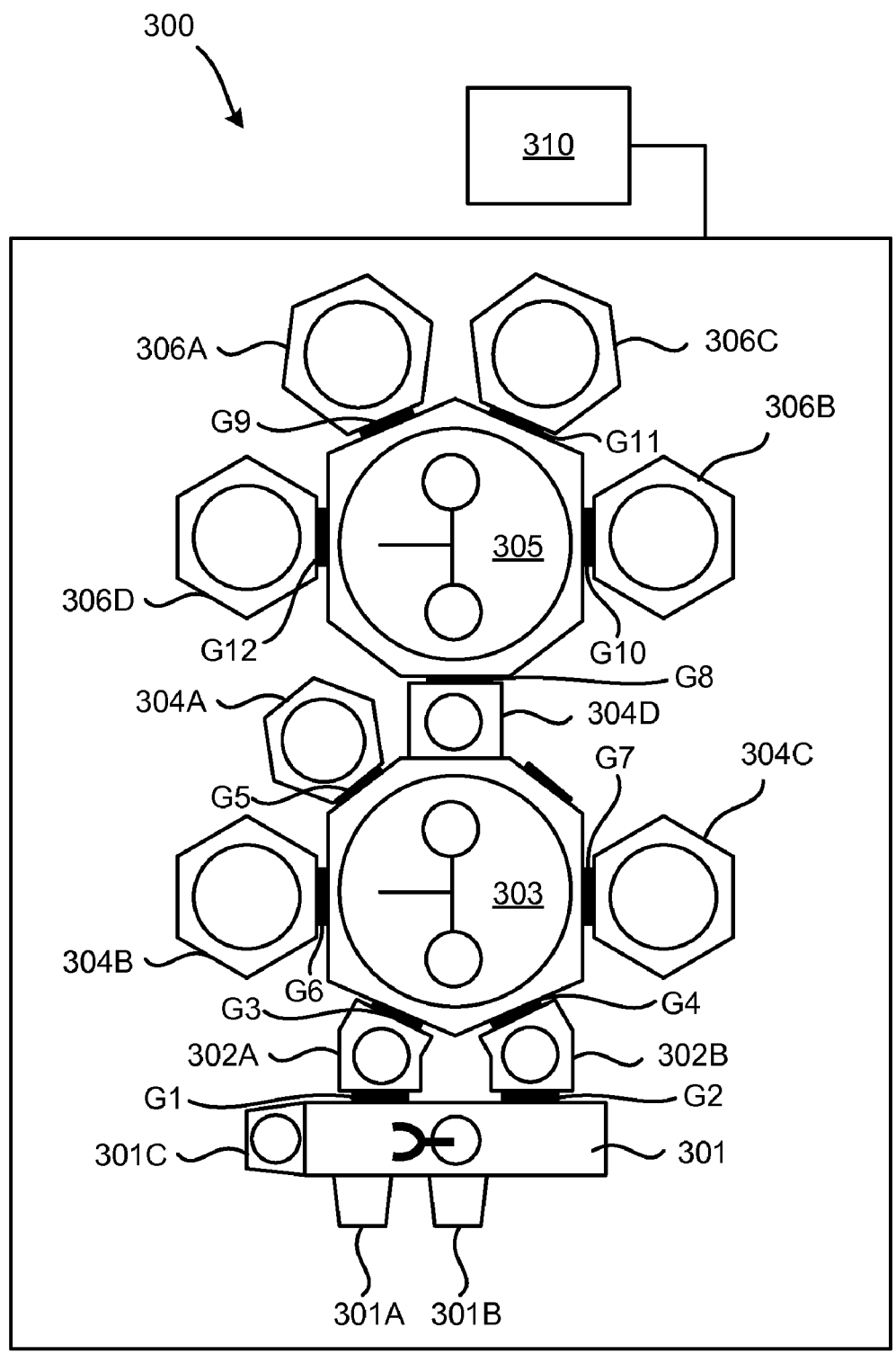
FIG. 3 is a schematic diagram of a vacuum processing tool for forming a stressed gate stack on a substrate according to an embodiment of the invention.

FIG. 3 is a schematic diagram of a vacuum processing tool for forming a stressed gate stack on a substrate according to embodiments of the invention. The vacuum processing tool 300 contains a first substrate (wafer) transfer system 301 that includes cassette modules 301A and 301B, and a substrate alignment module 301C. Load-lock chambers 302A and 302B are coupled to the substrate transfer system 301 using gate valves G1 and G2, respectively. The first substrate transfer system 301 is maintained at atmospheric pressure but a clean environment is provided by purging with an inert gas. The load lock chambers 302A and 302B are coupled to a second substrate transfer system 303 using gate valves G3 and G4. The second substrate transfer system 303 may be maintained at a base pressure of about 100 mTorr, or lower, using a turbomolecular pump (not shown). The second substrate transfer system 303 includes a substrate transfer robot and is coupled to degassing system 304A, precleaning system 304B for precleaning a substrate or an integrated circuit structure on a substrate prior to further processing, and an auxiliary processing system 304C. According to one embodiment, the auxiliary processing system 304C may be a film deposition system for depositing a high-k dielectric film on a substrate. The processing systems 304A, 304B, and 304C are coupled to the second substrate transfer system 303 using gate valves G5, G6, and G7, respectively.

Furthermore, the second substrate transfer system 303 is coupled to a third substrate transfer system 305 through substrate handling chamber 304D and gate valve G8. As in the second substrate transfer system 303, the third substrate transfer system 305 may be maintained at a base pressure of about 100 mTorr, or lower, using a turbomolecular pump (not shown). The third substrate transfer system 305 includes a substrate transfer robot.

Coupled to the third substrate transfer system 305 is a first processing system 306A configured for depositing a metal-containing gate electrode film on a substrate and a plurality of processing systems 306B-306D that may be used alone or in combination to modify a surface layer of the metal-containing gate electrode film to form a modified surface layer. In one example, the first processing system 306A can include a film deposition system 400 schematically shown in FIG. 4.

Figure 7:
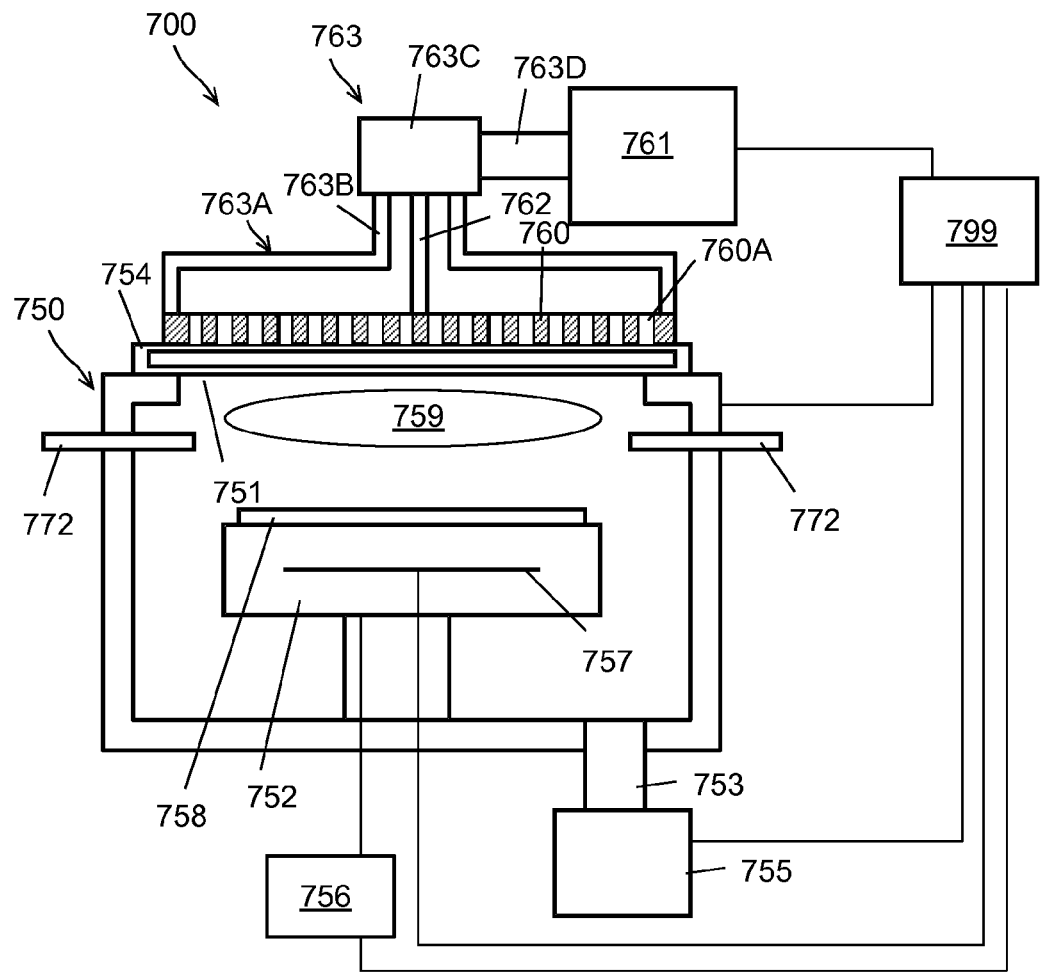
FIG. 7 is a schematic diagram of a plasma processing system containing a slot plane antenna (SPA) plasma source for performing a modifying process according to one embodiment of the invention.

Coupled to the third substrate transfer system 305 is a second processing system 306B configured for modifying a surface layer of the metal-containing gate electrode film by exposing the metal-containing gate electrode film to a process gas exited by plasma induced dissociation using low electron temperature plasma formed by microwave irradiation via a plane antenna member having a plurality of slots (slot plane antenna (SPA) plasma source). The process gas can contain or consist of a non-metal-containing gas, including an oxygen-containing gas (e.g., $O_2$, $H_2O$, or $H_2O_2$), a nitrogen-containing gas (e.g., $N_2$, $NH_3$, $N_2H_4$, or $N_2H_6$), an oxygen- and nitrogen-containing gas (e.g., NO, $N_2O$, or $NO_2$). One example of a SPA plasma processing system is schematically shown in FIG. 7.

Figure 5:
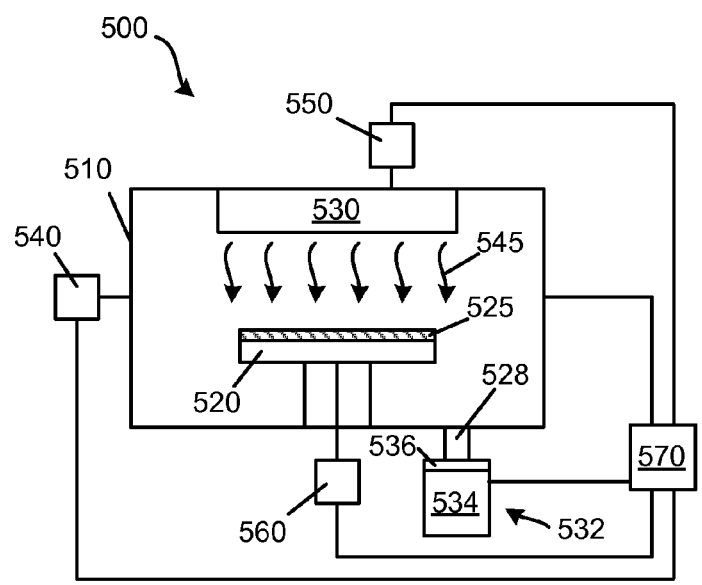
FIG. 5 is a schematic diagram of a processing system containing a non-ionizing electromagnetic radiation source for performing a modifying process according to one embodiment of the invention.
Figure 6:
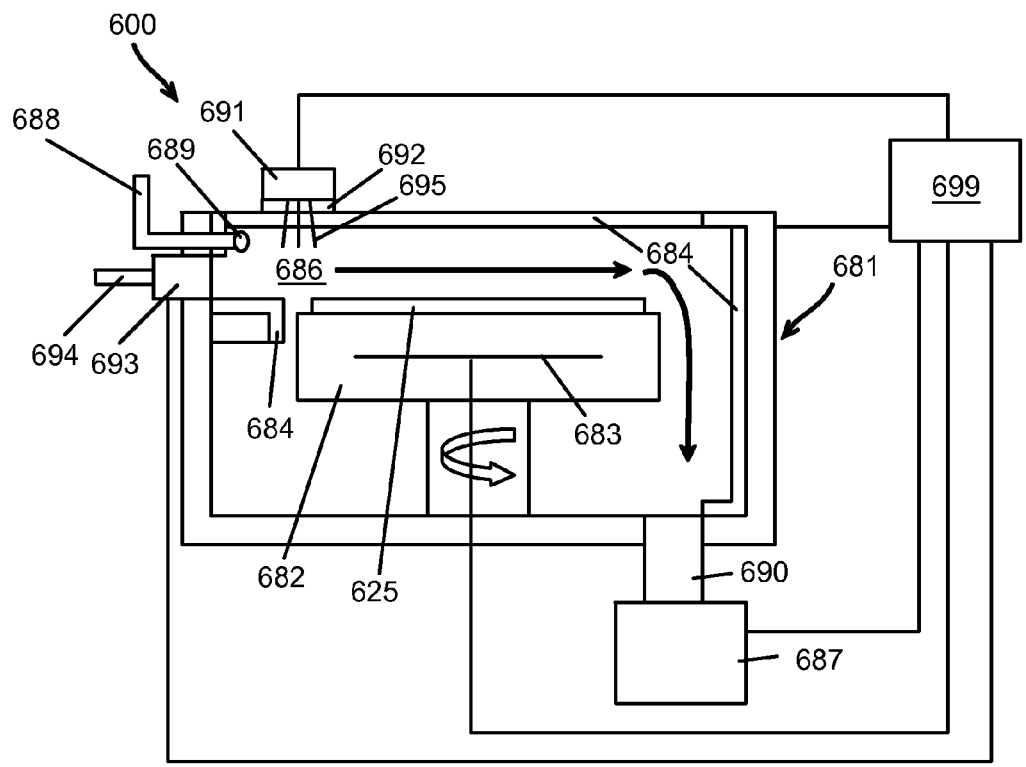
FIG. 6 is a schematic diagram of another processing system containing a non-ionizing electromagnetic radiation source for performing a modifying process according to one embodiment of the invention.

Further, coupled to the third substrate transfer system 305 is third processing system 306C configured for modifying a surface layer of the metal-containing gate electrode film by exposing the metal-containing gate electrode film to oxygen radicals, nitrogen radicals, or oxygen- and nitrogen radicals formed by non-ionizing electromagnetic (e.g., ultraviolet (UV)) radiation induced dissociation of a process gas containing an oxygen-containing gas (e.g., $O_2$, $H_2O$, or $H_2O_2$), a nitrogen-containing gas (e.g., $N_2$, $NH_3$, $N_2H_4$, or $N_2H_6$), an oxygen- and nitrogen-containing gas (e.g., NO, $N_2O$, or $NO_2$) Examples of a third processing system 306C are schematically shown in FIGS. 5 and 6.

A fourth processing system 306D is configured for low-pressure modifying a surface layer of the metal-containing gate electrode film by thermal exposure to a non-plasma excited or non-electromagnet radiation excited process gas containing an oxygen-containing gas (e.g., $O_2$, $H_2O$, or $H_2O_2$), a nitrogen-containing gas (e.g., $N_2$, $NH_3$, $N_2H_4$, or $N_2H_6$), an oxygen- and nitrogen-containing gas (e.g., NO, $N_2O$, or $NO_2$). According to some embodiments, the fourth processing system 306D is configured for heat-treating the modified surface layer of the metal-containing gate electrode films at a temperature between 100° C. and 600° C. in the presence of an inert gas (e.g., Ar or $N_2$), $H_2$, or $O_2$. According to some embodiments, one or more of the processing systems 306A-306C may be configured for heat-treating a film structure at a temperature between 100° C. and 600° C. The processing systems 306A, 306B, 306C, and 306D are coupled to the substrate transfer system 305 using gate valves G9, G10, G11, and G12, respectively.

The third substrate transfer system 305 and processing systems 306A-306D are capable of maintaining a base pressure of background gases at about 100 mTorr, or lower, during the integrated processing, thereby enabling formation of stressed gate stacks without exposure to air under well-controlled process conditions that provide great flexibility for tailoring the material properties and stress induced in the films.

The vacuum processing tool 300 includes a controller 310 that can be coupled to and control any or all of the processing systems and processing elements depicted in FIG. 3 during the integrated substrate processing. Alternatively, or in addition, controller 310 can be coupled to one or more additional controllers/computers (not shown), and controller 310 can obtain setup and/or configuration information from an additional controller/computer. The controller 310 can be used to configure any or all of the processing systems and processing elements, and the controller 310 can collect, provide, process, store, and display data from any or all of the processing systems and processing elements. The controller 310 can include a number of applications for controlling any or all of the processing systems and processing elements. For example, controller 310 can include a graphic user interface (GUI) component (not shown) that can provide easy to use interfaces that enable a user to monitor and/or control one or more processing systems processing elements.

The controller 310 can include a microprocessor, memory, and a digital I/O port capable of generating control voltages sufficient to communicate, activate inputs, and exchange information with the vacuum processing tool 300 as well as monitor outputs from the vacuum processing tool 300. For example, a program stored in the memory may be utilized to activate the inputs of the vacuum processing tool 300 according to a process recipe in order to perform integrated substrate processing.

However, the controller 310 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 310 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media is software for controlling the controller 310, for driving a device or devices for implementing the invention, and/or for enabling the controller 310 to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The controller 310 may be locally located relative to the vacuum processing tool 300, or it may be remotely located relative to the vacuum processing tool 300. For example, the controller 310 may exchange data with the vacuum processing tool 300 using at least one of a direct connection, an intranet, the Internet and a wireless connection. The controller 310 may be coupled to an intranet at, for example, a customer site (i.e., a device maker, etc.), or it may be coupled to an intranet at, for example, a vendor site (i.e., an equipment manufacturer). Additionally, for example, the controller 310 may be coupled to the Internet. Furthermore, another computer (i.e., controller, server, etc.) may access, for example, the controller 310 to exchange data via at least one of a direct connection, an intranet, and the Internet. As also would be appreciated by those skilled in the art, the controller 310 may exchange data with the vacuum processing tool 300 via a wireless connection.

As those skilled in the art will readily recognize, embodiments of the invention may not require the use of all the processing systems of the vacuum processing tool 300 depicted in FIG. 3. For example, according to one embodiment, a metal-containing gate electrode film may be deposited in the first processing system 306A, and thereafter a surface layer of the metal-containing gate electrode film modified and heat-treated in one or more of processing systems 306B, 306C, and 306D. In one embodiment, a metal-containing gate electrode film may be modified, in any order, in processing systems 306B and/or 306C, and thereafter heat-treated in the fourth processing system 306D.

Figure 2:
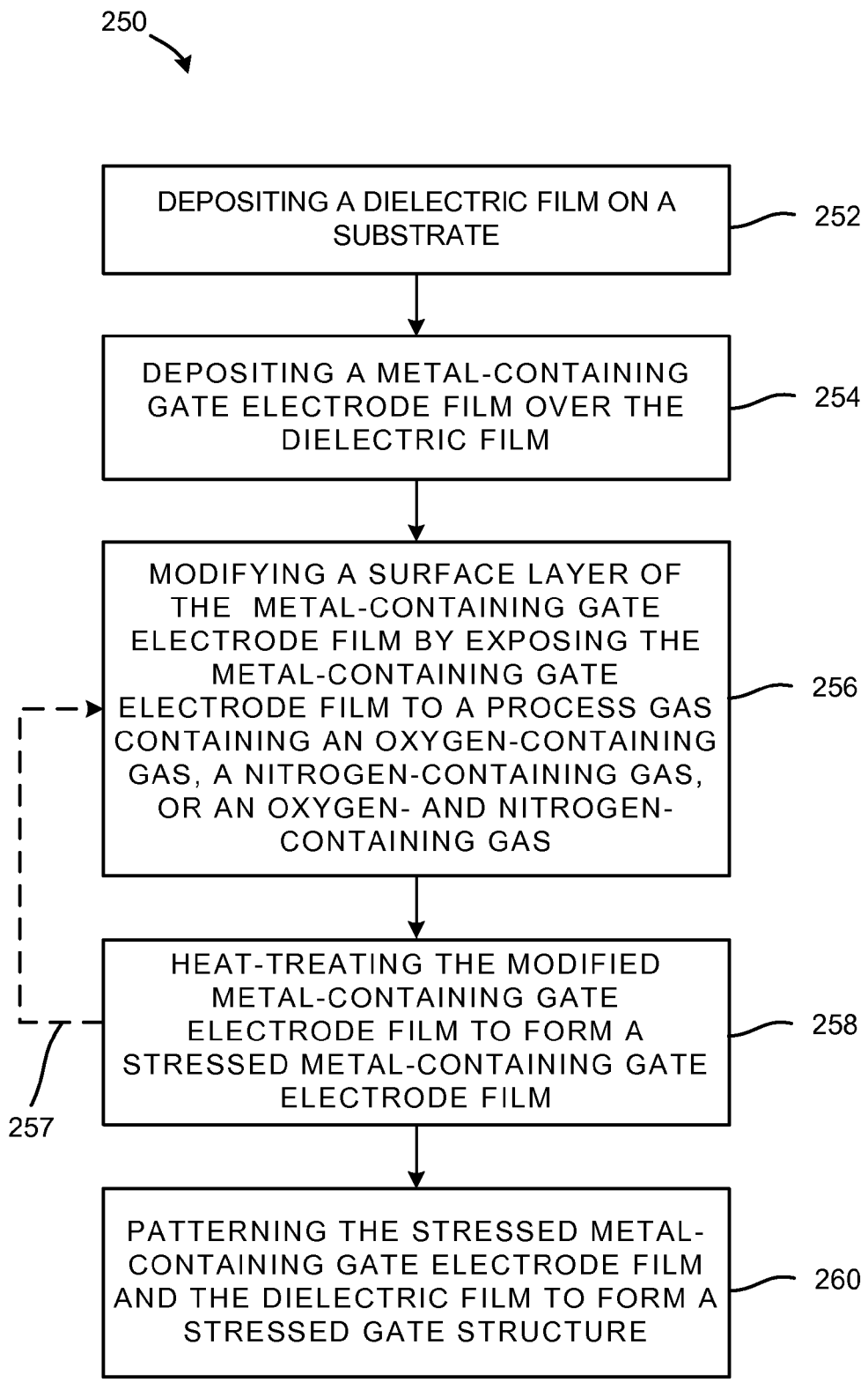
FIG. 2 is a process flow diagram for forming a stressed gate stack on a substrate according to an embodiment of the invention.

FIG. 2 is a process flow diagram for forming a stressed gate stack on a substrate according to an embodiment of the invention. Referring now to FIGS. 2 and 3, a method of forming a stressed gate stack on a substrate is described. The substrate is provided in the cassette modules 301A or 301B for processing in the vacuum processing tool 300. The substrate is introduced into the substrate transfer system 303 from the substrate transfer system 301 through the gate valve G1 and the load lock chamber 302A or through the gate valve G2 and the load lock chamber 302B, after a substrate aligning step in the substrate alignment module 301C. The substrate is then transferred from the substrate transfer system 303 to the processing system 304A through the gate valve G5. In the processing system 304A, the substrate may be degassed and/or cleaned by heating and/or exposed to ultraviolet radiation in an inert gas environment to remove water and any residual gas from the substrate.

After degassing and/or cleaning in the processing system 304A, the substrate is returned to the substrate transfer system 303 through the gate valve G5, and next the substrate is transported to the processing system 304B through the gate valve G6 for precleaning. In block 252 of process flow 250, a dielectric film is deposited on the substrate in the auxiliary processing system 304C. Thereafter, the substrate is returned to the substrate transfer system 303 through the gate valve G7, and then transferred to the substrate transfer system 305 from the substrate handling chamber 304D through the gate valve G8. Once in the substrate transfer system 305, the substrate is introduced into the first processing system 306A through the gate valve G9 for depositing a metal-containing gate electrode film on the substrate in block 254 of the process flow 250. FIG. 1A shows an exemplary metal-containing gate electrode film 106 on a dielectric film 104. According to another embodiment, the dielectric film 104 may be deposited on the substrate prior to introducing the substrate into the vacuum processing tool 300.

Figure 4:
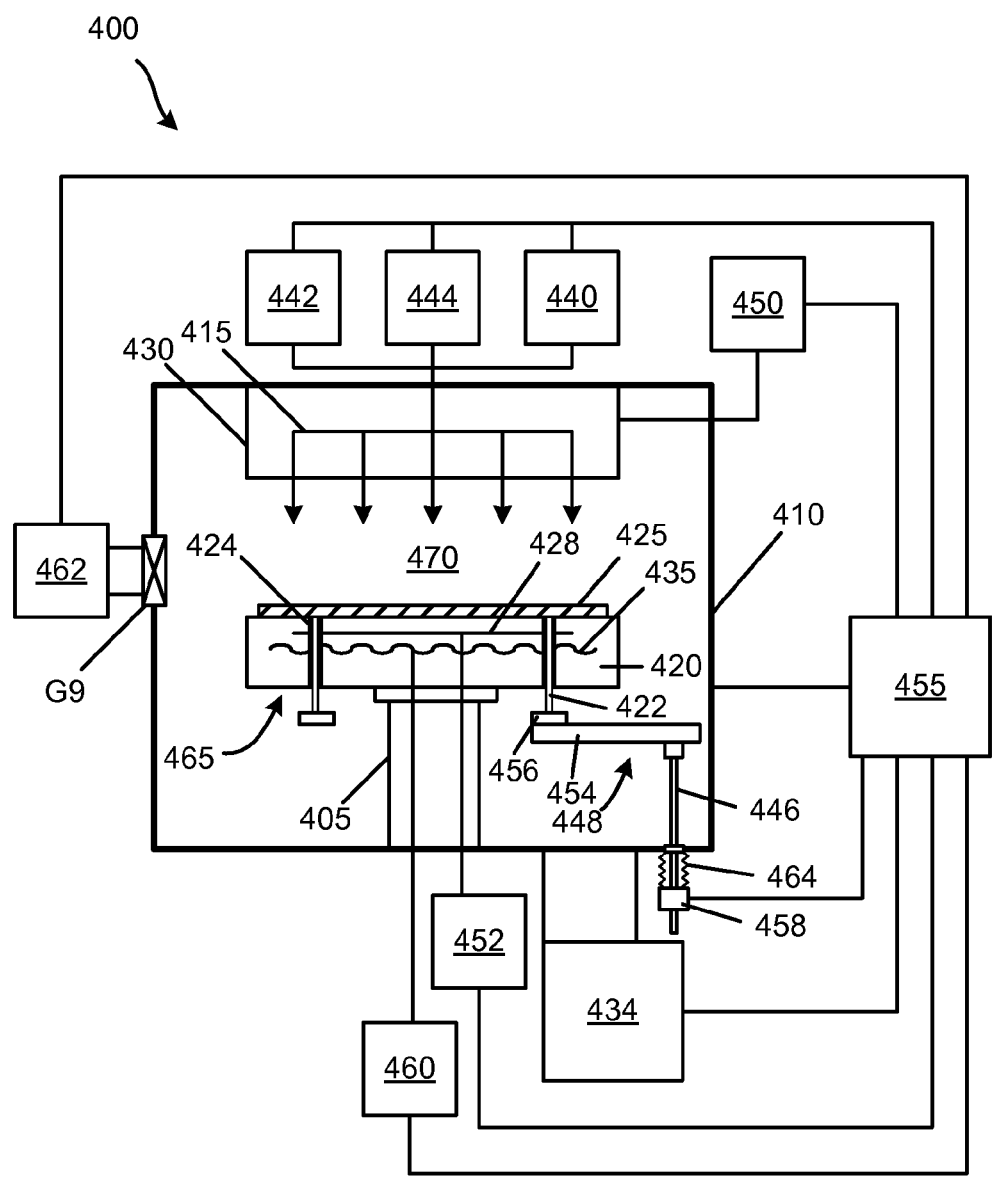
FIG. 4 is a schematic diagram of a film deposition system for depositing a metal-containing gate electrode film on a substrate according to an embodiment of the invention.

After depositing the metal-containing gate electrode film 106 in the first processing system 306A, the substrate is returned to the substrate transfer system 305 through the gate valve G9. Next, the substrate is sequentially introduced into one or more of the processing systems 306B, 306C, or 306D, for modifying the surface layer 107 of the metal-containing gate electrode film 106 and heat-treating the modified surface layer 114. According to some embodiments of the invention, the third processing system 306C contains a non-ionizing electromagnetic radiation (EM) source for performing a modifying process. Examples of such processing systems are schematically shown in FIGS. 4 and 5. According to some embodiments of the invention, the second processing system 306B contains a slot plane antenna (SPA) plasma source. An example of such a processing system is schematically shown in FIG. 6. According to some embodiments of the invention, the fourth processing system 306D is configured for thermal oxidation or nitridation of the surface layer 107 and/or heat-treating a modified surface layer 114.

In one example, the substrate may be sequentially transferred into processing systems 306B or 306C, in any order, for modifying the surface layer 107 of the metal-containing gate electrode film 106 in block 256 of the process flow 250. Following the modifying in one or more of the processing systems 306B and 306C, the substrate is returned to the substrate transfer system 305 and thereafter the substrate may be introduced into the fourth processing system 306D through the gate valve G11 for heat-treating the modified metal-containing gate electrode film to form a stressed metal-containing gate electrode film with a desired oxygen, nitrogen, or oxygen and nitrogen, depth profile in the stressed metal-containing gate electrode film and to improve the electrical and material properties of the stressed metal-containing gate electrode film.

According to some embodiments of the invention, the heat-treating can be performed in the fourth processing system 306D as described above, but alternatively or in addition, the heat-treating may be performed in processing systems 306A, 306B, or 306C. According to one embodiment, the modifying in block 256 may at least partially overlap with the heat-treating step in block 258. According to another embodiment, the steps in blocks 256 and 258 may have no temporal overlap. The heat-treating conditions can include a pressure of about 50 mTorr to about 760 Torr, or a pressure of about 1 Torr to about 10 Torr, using a gas containing $O_2$, $N_2$, $H_2$, Ar, He, Ne, Xe, or Kr, or any combination thereof, at a flow rate of 0 to 20 standard liters per minute (slm), or at a flow rate of 0.1 slm to 5 slm. The heat-treating may be carried out for a time period between about 5 seconds and about 5 minutes, or between about 30 seconds and about 2 minutes.

According to one embodiment, the modifying in block 256 includes forming, by a slot plane antenna (SPA) plasma source, low-energy excited oxidation or nitridation species from a first process gas in a plasma, and forming the modified surface layer by exposing a surface layer of the metal-containing gate electrode film to the excited oxidation and/or nitridation species to incorporate oxygen, nitrogen, or oxygen and nitrogen, into the surface layer. The modifying further includes forming, by non-ionizing electromagnetic (EM) radiation, oxygen radicals, nitrogen radicals, or oxygen and nitrogen radicals, from a second process gas, and exposing the modified metal-containing gate electrode film to the oxygen radicals, the nitrogen radicals, or the oxygen and nitrogen radicals, to incorporate additional oxygen, additional nitrogen, or additional oxygen and nitrogen, into the modified surface layer.

According to one embodiment, the modifying in block 256 includes forming, by non-ionizing electromagnetic (EM) radiation, oxygen radicals, nitrogen radicals, or oxygen and nitrogen radicals, from a first process gas, and forming the modified surface layer by exposing a surface layer of the metal-containing gate electrode film to the oxygen radicals, the nitrogen radicals, or the oxygen and nitrogen radicals, to incorporate oxygen, nitrogen, or oxygen and nitrogen, into the surface layer. The modifying further includes forming, by a slot plane antenna (SPA) plasma source, low-energy excited oxidation and/or nitridation species from a second process gas in a plasma, and exposing the modified metal-containing gate electrode film to the excited oxidation and/or nitridation species to incorporate additional oxygen, nitrogen, or additional oxygen and nitrogen, into the modified surface layer.

According to one embodiment, the process flow 250 includes modifying a surface layer of the metal-containing gate electrode film by exposing the metal-containing gate electrode film to a process gas containing an oxygen-containing gas, a nitrogen-containing gas, or an oxygen- and nitrogen-containing gas, where a thickness of the modified surface layer is less than the total thickness of the metal-containing gate electrode film, following the modifying, heat-treating the modified metal-containing gate electrode film, repeating the modifying and heat-treating at least once to form a stressed metal-containing gate electrode film, and patterning in step 260 the stressed metal-containing gate electrode film and the dielectric film to form a stressed gate stack that exhibits stress over the substrate. In one example, the modifying and repeating the modifying steps use a slot plane antenna (SPA) plasma source, a non-ionizing electromagnetic (EM) radiation, or both.

After the heat-treating in block 258, the heat-treated substrate is returned to the substrate transfer system 305 and to the substrate transfer system 303 through the gate valve G11 and the substrate handling chamber 304D. Thereafter, the substrate is returned to the substrate transfer system 301 from the substrate transfer system 303 through the gate valve G3, load lock chamber 302A and the gate valve G1, or through the gate valve G4, the load lock chamber 302B and the gate valve G2. Next, the substrate is returned to the cassette module 301A or 301B and removed from the vacuum processing tool 300.

According to one embodiment of the invention, the modifying and heat-treating steps in blocks 254 and 256 may be sequentially performed a plurality of times as indicated by process arrow 257. In one example, the plurality of modifying steps may be performed in the same processing system (e.g., one of the processing systems 306B or 306C). In another example, the plurality of modifying steps may be sequentially performed in different processing systems (e.g., in processing systems 306B and 306C). In one example, a first modifying step may be performed in the processing system 306B and a second modifying step may be performed in the third processing system 306C. In another example, a first modifying step may be performed in the third processing system 306C and a second modifying step may be performed in the processing system 306B. In some embodiments, a heat-treating step may be performed between the one or more modifying steps. In other embodiments, a heat-treating step may be performed after the plurality of modifying steps.

FIG. 4 is a schematic diagram of a film deposition system for depositing a metal-containing gate electrode film on a substrate according to one embodiment of the invention. The film deposition system 400 may be configured for depositing a metal-containing gate electrode film on substrate 425 by a physical vapor deposition (PVD) process, a thermal chemical vapor deposition (CVD) process, a plasma-enhanced CVD (PECVD) process, an atomic layer deposition (ALD) process, or a plasma-enhanced ALD (PEALD) process, for example. The film deposition system 400 contains a process chamber 410 having a substrate holder 420 configured to support the substrate 425 to be processed. The substrate holder 420 is mounted on a pedestal 405 on a lower surface 465 of the substrate holder 420.

The substrate 425 is transferred into and out of the process chamber 410 through a gate valve G9 via substrate transfer system 462. When transferred into the process chamber 410, the substrate 425 is received by a lift mechanism 448 containing substrate lift pins 422 housed in holes 424 within the substrate holder 420. The film deposition system 400 contains three lift pins 422 (only two are shown in FIG. 4). The lift pins 422 are made of quartz or a ceramic material such as $Al_2O_3$, $SiO_2$, or MN. Once the substrate 425 is received from the substrate transfer system 462, it is lowered to an upper surface of the substrate holder 420. The lower end portion of each lift pin 422 rests against a support plate 456 attached to an arm 454. The arm 454 is connected to a rod 446 of an actuator 458 positioned below the process chamber 410. The rod 446 extends through bellows 464 positioned at the bottom on the process chamber 410.

The process chamber 410 contains an upper assembly 430 coupled to a first process material supply system 440, a second process material supply system 442, and a purge gas supply system 444. The upper assembly 430 can contain a showerhead having a large number of gas delivery holes formed in a lower surface of the showerhead and facing the substrate 425 for delivering gases 415 into processing space 470 above the substrate 425. The first process material supply system 440 and the second process material supply system 442 can be configured to simultaneously or alternately introduce first and second process materials to the process chamber 410. The alternation of the introduction of the first and second process materials can be cyclical, or it may be acyclical with variable time periods between introduction of the first and second process materials.

The first process material can contain a deposition gas containing a metal precursor which may be delivered to process chamber 410 in a gaseous phase with or without the use of a carrier gas. The second process material can contain a reducing agent, which may include a reducing precursor containing nitrogen to be incorporated in a metal-containing gate electrode film formed on the substrate 425.

According to some embodiments of the invention, the metal-containing gate electrode film can consist of or contain W, WN, Al, Mo, Ta, TaN, TaAlN, TaC, TaSiN, HfN, HfSiN, Ti, TiN, TiAlN, TiSiN, Mo, MoN, Re, or Ru, or combinations of two or more thereof.

Exemplary processing conditions during deposition of a metal-containing gate electrode film include a substrate temperature between about 200° C. and about 800° C., and a process chamber pressure between about 50 mTorr and about 10 Torr, for example between about 200 mTorr and 3 Torr.

The purge gas supply system 444 is configured to introduce a purge gas to process chamber 410. For example, the introduction of purge gas may occur during and/or between introduction of the first and second process materials to the process chamber 410, or following the introduction of the second process material to process chamber 410. The purge gas can contain an inert gas, such as a noble gas (i.e., helium, neon, argon, xenon, krypton), or nitrogen ($N_2$), or hydrogen ($H_2$).

The film deposition system 400 contains a plasma generation system configured to optionally generate plasma in the processing space 470 during deposition of the metal-containing gate electrode film. The plasma generation system includes a first power source 450 coupled to the process chamber 410 and configured to couple power to the first process material, or the second process material, or both, in the processing space 470 by energizing the upper assembly 430. The first power source 450 may be a variable power source and may include a radio frequency (RF) generator and an impedance match network, and may further include an electrode through which RF power is coupled to the plasma in process chamber 410. The electrode can be formed in the upper assembly 430, and it can be configured to oppose the substrate holder 420. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 410 by reducing the reflected power. Match network topologies (e.g. L-type, π-type, T-type, etc.) and automatic control methods are well known to those skilled in the art. A typical frequency for the application of RF power to the electrode formed in the upper assembly 430 can, for example, range from 10 MHz to 200 MHz and can be 60 MHz, and the RF power applied can, for example, be between about 500 Watts (W) and about 2200 W.

Alternatively, the first power source 450 may include a radio frequency (RF) generator and an impedance match network, and may further include an antenna, such as an inductive coil, through which RF power is coupled to plasma in process chamber 410. The antenna can, for example, include a helical or solenoidal coil, such as in an inductively coupled plasma source or helicon source, or it can, for example, include a flat coil as in a transformer coupled plasma source.

Alternatively, the first power source 450 may include a microwave frequency generator, and may further include a microwave antenna and microwave window through which microwave power is coupled to plasma in process chamber 410. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

The film deposition system 400 contains a substrate bias system configured to optionally generate or assist in generating plasma during deposition of the metal-containing gate electrode film. The substrate bias system includes a substrate power source 452 coupled to the process chamber 410, and configured to couple power to the substrate holder 420. The substrate power source 452 contains a RF generator and an impedance match network. The substrate power source 452 is configured to couple power to the first process material, or the second process material, or both, in the processing space 470 by energizing an electrode 428 in the substrate holder 420. A typical frequency for the RF bias can range from about 0.1 MHz to about 100 MHz, and can be 13.56 MHz. RF bias systems for plasma processing are well known to those skilled in the art. Alternatively, RF power is applied to the electrode 428 at multiple frequencies.

The film deposition system 400 contains a substrate temperature control system 460 coupled to the substrate holder 420 and configured to elevate, lower, and control the temperature of substrate 425. The substrate temperature control system 460 is coupled to a resistive heating element 435 in the substrate holder 420. The substrate temperature control system 460 can further contain temperature control elements, such as a cooling system including a re-circulating coolant flow that receives heat from the substrate holder 420 and transfers heat to a heat exchanger system (not shown). Additionally, the temperature control elements can include heating/cooling elements which can be included in the substrate holder 420, as well as the chamber wall of the process chamber 410 and any other component within the film deposition system 400.

In order to improve the thermal transfer between the substrate 425 and the substrate holder 420, the substrate holder 420 can include a mechanical clamping system, or an electrical clamping system, such as an electrostatic clamping system, to affix the substrate 425 to an upper surface of substrate holder 420. Furthermore, the substrate holder 420 can further include a substrate backside gas delivery system configured to introduce gas to the backside of substrate 425 in order to improve the gas-gap thermal conductance between the substrate 425 and the substrate holder 420. Such a system can be utilized when good temperature control of the substrate 425 is required at elevated or reduced temperatures. For example, the substrate backside gas system can contain a two-zone gas distribution system, wherein the helium gas gap pressure can be independently varied between the center and the edge of the substrate 425.

Furthermore, the process chamber 410 is coupled to a pressure control system 434 that includes a vacuum pumping system and a variable gate valve for controllably evacuating the process chamber 410 to a pressure suitable for processing the substrate 425, and suitable for use of the first and second process materials. The vacuum pumping system can include a turbo-molecular vacuum pump (TMP) or a cryogenic pump capable of a pumping speed up to about 5000 liters per second (and greater). In conventional plasma processing devices utilized for thin film deposition or dry etching, a 300 to 5000 liter per second TMP is generally employed. Moreover, a device for monitoring chamber pressure, for example a capacitance manometer (not shown) can be coupled to the process chamber 410.

The film deposition system 400 contains a controller 455 that is coupled to the process chamber 410, pressure control system 434, first process material supply system 440, second process material supply system 442, purge gas supply system 444, first power source 450, substrate power source 452, actuator 458, substrate temperature control system 460, and substrate transfer system 462. In addition, the controller 455 can be coupled to one or more additional controllers/computers (not shown), and the controller 455 can obtain setup and/or configuration information from an additional controller/computer. The controller 455 can be used to configure, collect, provide, process, store, and display data from the film deposition system 400. The controller 455 can contain a number of applications for controlling the film deposition system 400. For example, controller 455 can include a graphic user interface (GUI) component (not shown) that can provide easy to use interfaces that enable a user to monitor and/or control the film deposition system 400.

The controller 455 can contain a microprocessor, memory, and a digital I/O port capable of generating control voltages sufficient to communicate and activate inputs to the film deposition system 400 as well as monitor outputs from the film deposition system 400. For example, a program stored in the memory may be utilized to activate the inputs of the film deposition system 400 according to a process recipe in order to perform a film deposition process. The controller 455 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 455 includes at least one computer readable medium or memory, such as the controller memory, for holding instructions programmed according to the teachings of the invention and for containing data structures, tables, records, or other data that may be necessary to implement embodiments of the invention. Stored on any one or on a combination of computer readable media, the present invention includes software for controlling the controller 455, for driving a device or devices for implementing embodiments of the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

FIG. 5 is a schematic diagram of a processing system containing a non-ionizing electromagnetic radiation source for performing a modifying process according to one embodiment of the invention. The radiation source can be a UV radiation source or a visible light radiation source, for example. The processing system 500 contains a process chamber 510 having a substrate holder 520 configured to support a substrate 525. The process chamber 510 further contains an electromagnetic radiation assembly 530 for exposing the substrate 525 to electromagnetic radiation. Additionally, the processing system 500 contains a power source 550 coupled to the electromagnetic radiation assembly 530, and a substrate temperature control system 560 coupled to substrate holder 520 and configured to elevate and control the temperature of substrate 525. A gas supply system 540 is coupled to the process chamber 510, and configured to introduce a process gas to process chamber 510. For example, the process gas can include an oxygen-containing gas, a nitrogen-containing gas, or an oxygen- and nitrogen-containing gas and optionally an inert gas such as a noble gas (i.e., helium, neon, argon, xenon, krypton). According to one embodiment of the invention, the process gas consists of $O_2$. According to other embodiments of the invention, the process gas consists of $N_2$ or $NH_3$. Additionally (not shown), a purge gas can be introduced to process chamber 510. The purge gas may contain an inert gas, such as nitrogen or a noble gas.

The electromagnetic radiation assembly 530 can, for example, contain an ultraviolet (UV) radiation source. The UV source may be monochromatic or polychromatic. Additionally, the UV source can be configured to produce UV radiation 545 at a wavelength sufficient for dissociating an oxygen-containing gas, a nitrogen-containing gas, or an oxygen- and nitrogen-containing gas in the process gas. In one embodiment, the oxygen-containing gas can contain $O_2$ and the ultraviolet radiation can have a wavelength from about 145 nm to about 192 nm. Other wavelength may be used for other oxygen-containing gases, nitrogen-containing gases, or oxygen- and nitrogen-containing gases. The electromagnetic radiation assembly 530 can operate at a power ranging from about 5 $mW/cm^2$ to about 50 $mW/cm^2$. The electromagnetic radiation assembly 530 can include one, two, three, four, or more radiation sources. The sources can include lamps or lasers or a combination thereof.

The processing system 500 contains a substrate temperature control system 560 coupled to the substrate holder 520 and configured to elevate and control the temperature of substrate 525. Substrate temperature control system 560 contains temperature control elements, such as a heating system that may contain resistive heating elements, or thermo-electric heaters/coolers. Additionally, substrate temperature control system 560 may contain a cooling system including a re-circulating coolant flow that receives heat from substrate holder 520 and transfers heat to a heat exchanger system (not shown), or when heating, transfers heat from the heat exchanger system. Furthermore, the substrate temperature control system 560 may include temperature control elements disposed in the chamber wall of the process chamber 510 and any other component within the processing system 500.

Furthermore, the process chamber 510 is further coupled to a pressure control system 532, including a vacuum pumping system 534 and a valve 536, through a duct 538, wherein the pressure control system 532 is configured to controllably evacuate the process chamber 510 to a pressure suitable for processing the substrate 525. Moreover, a device for monitoring chamber pressure (not shown) can be coupled to the process chamber 510.

Additionally, the processing system 500 contains a controller 570 coupled to the process chamber 510, vacuum pumping system 534, gas supply system 540, power source 550, and substrate temperature control system 560. Alternatively, or in addition, controller 570 can be coupled to a one or more additional controllers/computers (not shown), and controller 570 can obtain setup and/or configuration information from an additional controller/computer.

The controller 570 can contain a microprocessor, memory, and a digital I/O port capable of generating control voltages sufficient to communicate and activate inputs to processing system 500 as well as monitor outputs from processing system 500. For example, a program stored in the memory may be utilized to activate the inputs to the aforementioned components of the processing system 500 according to a process recipe in order to perform process.

Modifying a surface layer of a metal-containing gate electrode film in the processing system 500 can include a substrate temperature between about 200° C. and about 800° C., for example about 700° C. Alternatively, the substrate temperature can be between about 400° C. and about 700° C. The pressure in the process chamber 510 can, for example, be maintained between about 10 mTorr and about 20 Torr, for example about 100 mTorr. Alternatively, the pressure can be maintained between about 20 mTorr and about 1 Torr. According to one embodiment of the invention, the process gas consists of $O_2$ that may be introduced into the process chamber 510 at a flow rate between about 100 standard cubic centimeters per minute (sccm) and about 2 slm. According to another embodiment of the invention, the process gas can consist of $O_2$ and an inert gas such as a noble gas (i.e., helium, neon, argon, xenon, krypton). According to another embodiment of the invention, the process gas can consist of $NH_3$ and an inert gas such as a noble gas (i.e., helium, neon, argon, xenon, krypton). A flow rate of the inert gas can, for example, be between 0 slm and about 2 slm, or between 0.1 slm and 1 slm. In one example, the process gas consists of $O_2$ and Ar. Exemplary gas exposure times are between about 10 seconds and about 5 min, or between about 30 seconds and about 2 minutes, for example about 1 minute.

FIG. 6 is a schematic diagram of another processing system containing a non-ionizing radiation source for performing a modifying process according to one embodiment of the invention. The radiation source can be a UV radiation source or a visible light radiation source, for example. The processing system 600 includes a process chamber 681 accommodating therein a rotatable substrate holder 682 equipped with a heater 683 that can be a resistive heater. Alternatively, the heater 683 may be a lamp heater or any other type of heater. Furthermore the process chamber 681 contains an exhaust line 690 connected to the bottom portion of the process chamber 681 and to a vacuum pump 687. The substrate holder 682 can be rotated by a drive mechanism (not shown). The process chamber 681 contains a processing space 686 above the substrate 625. The inner surface of the process chamber 681 contains an inner liner 684 made of quartz in order to suppress metal contamination of the substrate 625 to be processed.

The process chamber 681 contains a gas line 688 with a nozzle 689 located opposite the exhaust line 690 for flowing a process gas containing an oxygen-containing gas, a nitrogen-containing gas, or an oxygen- and nitrogen-containing gas over the substrate 625. The process gas flows over the substrate 625 in a processing space 686 and is evacuated from the process chamber 681 by the exhaust line 690.

The process gas supplied from the nozzle 689 is activated by non-ionizing electromagnetic radiation 695 generated by an electromagnetic radiation source 691 emitting non-ionizing electromagnetic radiation 695 through a transmissive window 692 (e.g., quartz) into the processing space 686 between the nozzle 689 and the substrate 625. The transmissive window 692 separates the electromagnetic radiation source 691 from the reduced pressure processing space 686. The electromagnetic radiation source 691 is configured to generate non-ionizing electromagnetic radiation 695 capable of dissociating the oxygen-containing gas, the nitrogen-containing gas, or the oxygen- and nitrogen-containing gas to form neutral O radicals, neutral N radicals, or neutral O and N radicals, that flow along the surface of the substrate 625, thereby exposing the substrate 625 to the neutral radicals. Unlike during plasma processing, substantially no ions are formed in the processing space 686 from dissociation of the oxygen-containing gas, the nitrogen-containing gas, or the oxygen- and nitrogen-containing gas, by the non-ionizing electromagnetic radiation 695. According to one embodiment of the invention, the electromagnetic radiation source 691 is configured to generate UV radiation with a wavelength between about 145 nm to about 192 nm, for example 172 nm. Although only one electromagnetic radiation source 691 is depicted in FIG. 6, other embodiments of the invention contemplate the use of a plurality of electromagnetic radiation sources 691 above the substrate 625.

Furthermore, the process chamber 681 contains a remote RF plasma source 693 located opposite the exhaust line 690. The remote RF plasma source 693 may be utilized to form neutral and ionized plasma-excited species that may assist in the non-ionizing electromagnetic radiation-assisted modifying process described above. A second process gas containing an oxygen-containing gas, a nitrogen-containing gas, or an oxygen- and nitrogen-containing gas, can be supplied by gas line 694 to the remote RF plasma source 693 for forming the plasma-excited oxidation or nitridation species. The plasma-excited oxidation or nitridation species flow from the remote RF plasma source 693 along the surface of the substrate 625, thereby exposing the substrate 625 to the plasma-excited oxidation or nitridation species. According to one embodiment of the invention, in addition to exposing the substrate 625 to neutral O radicals, N radicals or O and N radicals, generated by the electromagnetic radiation source 691, the substrate may be exposed to the radicals generated by the remote RF plasma source 693 and transported to the processing space 686.

Still referring to FIG. 6, a controller 699 includes a microprocessor, a memory, and a digital I/O port capable of generating control voltages sufficient to communicate and activate inputs of the processing system 600 as well as monitor outputs from the processing system 600. Moreover, the controller 699 is coupled to and exchanges information with process chamber 681, the vacuum pump 687, the heater 683, the remote RF plasma source 693, and the electromagnetic radiation source 691. The controller 699 may be implemented as a UNIX-based workstation. Alternatively, the controller 699 can be implemented as a general-purpose computer, digital signal processing system, etc.

Further details of a processing system containing an UV radiation source are described in U.S. Pat. No. 6,927,112, titled "Radical Processing of a Sub-Nanometer Insulation Film", the entire contents of which is hereby incorporated by reference.

Modifying a surface layer of a metal-containing gate electrode film in the processing system 600 can include a substrate temperature between about 200° C. and about 800° C., for example about 700° C. Alternatively, the substrate temperature can be between about 400° C. and about 700° C. The pressure in the process chamber 610 can, for example, be maintained between about 10 mTorr and about 20 Torr, for example about 100 mTorr. Alternatively, the pressure can be maintained between about 20 mTorr and about 1 Torr. According to one embodiment of the invention, the process gas consists of $O_2$ that may be introduced into the process chamber 681 at a flow rate between about 100 sccm and about 2 slm. According to another embodiment of the invention, the process gas consists of $NH_3$ that may be introduced into the process chamber 681 at a flow rate between about 100 sccm and about 2 slm. According to another embodiment of the invention, the process gas consists of $N_2$ that may be introduced into the process chamber 681 at a flow rate between about 100 sccm and about 2 slm. According to another embodiment of the invention, the process gas can consist of $O_2$ and an inert gas such as a noble gas. According to another embodiment of the invention, the process gas can consist of $N_2$ and an inert gas such as a noble gas. According to another embodiment of the invention, the process gas can consist of $NH_3$ and an inert gas such as a noble gas. A flow rate of the inert gas can, for example, be between 0 sccm and about 2 slm. In one example, the process gas consists of $O_2$ and Ar. Exemplary gas exposure times are between about 10 sec and about 5 min, for example about 1 min.

FIG. 7 is a schematic diagram of a plasma processing system containing a slot plane antenna (SPA) plasma source for performing a modifying process according to one embodiment of the invention. The plasma produced in the plasma processing system 700 is characterized by low electron temperature and high plasma density that enables damage-free modifying of metal-containing gate electrode films according to embodiments of the invention. The plasma processing system 700 can, for example, be a TRIAS™ SPA processing system from Tokyo Electron Limited, Akasaka, Japan. The plasma processing system 700 contains a process chamber 750 having an opening portion 751 in the upper portion of the process chamber 750 that is larger than a substrate 725. A cylindrical dielectric top plate 754 made of quartz or aluminum nitride or aluminum oxide is provided to cover the opening portion 751. Gas lines 772 are located in the side wall of the upper portion of process chamber 750 below the top plate 754. In one example, the number of gas lines 772 can be 16 (only two of which are shown in FIG. 7). Alternatively, a different number of gas lines 772 can be used. The gas lines 772 can be circumferentially arranged in the process chamber 750, but this is not required for the invention. A process gas can be evenly and uniformly supplied into the plasma region 759 in process chamber 750 from the gas lines 772. The process gas can contain an oxygen-containing gas (e.g., $O_2$, $H_2O$, or $H_2O_2$), a nitrogen-containing gas (e.g., $N_2$, $NH_3$, or $N_2H_4$), an oxygen- and nitrogen-containing gas (e.g., NO, $N_2O$, or $NO_2$), or a combination thereof. The process gas can further contain an inert gas such as Ar.

In the plasma processing system 700, microwave power is provided to the process chamber 750 through the top plate 754 via a slot plane antenna 760 having a plurality of slots 760A. The slot plane antenna 760 faces the substrate 758 to be processed and the slot plane antenna 760 can be made from a metal plate, for example copper. In order to supply the microwave power to the slot plane antenna 760, a waveguide 763 is disposed on the top plate 754, where the waveguide 763 is connected to a microwave power supply 761 for generating microwaves with a frequency of about 2.45 GHz, for example. The waveguide 763 contains a flat circular waveguide 763A with a lower end connected to the slot plane antenna 760, a circular waveguide 763B connected to the upper surface side of the circular waveguide 763A, and a coaxial waveguide converter 763C connected to the upper surface side of the circular waveguide 763B. Furthermore, a rectangular waveguide 763D is connected to the side surface of the coaxial waveguide converter 763C and the microwave power supply 761.

Inside the circular waveguide 763B, an axial portion 762 of an electroconductive material is coaxially provided, so that one end of the axial portion 762 is connected to the central (or nearly central) portion of the upper surface of slot plane antenna 760, and the other end of the axial portion 762 is connected to the upper surface of the circular waveguide 763B, thereby forming a coaxial structure. As a result, the circular waveguide 763B is constituted so as to function as a coaxial waveguide. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz and the plasma may contain an electron temperature of less than about 3 eV, which includes 0.1, 0.3, 0.5, 0.7, 0.9, 1, 1.5, 2, 2.5, or 3 eV, or any combination thereof. The plasma may have a density of about $1 \times 10^{11}$/cm$^3$ to about $1 \times 10^{13}$/cm$^3$, or higher.

In addition, in the process chamber 750, a substrate holder 752 is provided opposite the top plate 754 for supporting and heating a substrate 725 (e.g., a wafer). The substrate holder 752 contains a heater 757 to heat the substrate 725, where the heater 757 can be a resistive heater. Alternatively, the heater 757 may be a lamp heater or any other type of heater. Furthermore the process chamber 750 contains an exhaust line 753 connected to the bottom portion of the process chamber 750 and to a vacuum pump 755.

The plasma processing system 700 further contains a substrate bias system 756 configured to optionally bias the substrate 758. The substrate bias system 756 includes a substrate power source configured couple power to the substrate holder 752. The substrate power source contains a RF generator and an impedance match network. The substrate power source is configured to couple power to the substrate holder 752 by energizing an electrode in the substrate holder 752. A typical frequency for the RF bias can range from about 0.1 MHz to about 100 MHz, and can be 13.56 MHz. RF bias systems for plasma processing are well known to those skilled in the art. Alternatively, RF power is applied to the electrode at multiple frequencies. In other embodiments, the substrate bias system 756 may include a DC generator.

Still referring to FIG. 7, a controller 799 includes a microprocessor, a memory, and a digital I/O port capable of generating control voltages sufficient to communicate and activate inputs of the plasma processing system 710 as well as monitor outputs from the plasma processing system 700. Moreover, the controller 799 is coupled to and exchanges information with process chamber 750, the vacuum pump 755, the heater 757, and the microwave power supply 761. A program stored in the memory is utilized to control the aforementioned components of plasma processing system 700 according to a stored process recipe. One example of controller 799 is a UNIX-based workstation. Alternatively, the controller 799 can be implemented as a general-purpose computer, digital signal processing system, etc.

Modifying a surface of a metal-containing gate electrode film in the plasma processing system 700 can include a substrate temperature between about 25° C. and about 800° C., for example about 400° C. Alternatively, the substrate temperature can be between about 400° C. and about 700° C. The pressure in the process chamber 750 can, for example, be maintained between about 10 mTorr and about 10 Torr, for example about 100 mTorr. Alternatively, the pressure can be maintained between about 20 mTorr and about 1 Torr. According to one embodiment of the invention, the process gas consists of $O_2$ that may be introduced into the process chamber 681 of FIG. 6 at a flow rate between about 5 sccm and about 1 slm. According to one embodiment of the invention, the process gas consists of $N_2$ that may be introduced into the process chamber 681 at a flow rate between about 5 sccm and about 1 slm. According to another embodiment of the invention, the process gas can consist of $O_2$ and an inert gas such as a noble gas. According to another embodiment of the invention, the process gas can consist of $NH_3$ and an inert gas such as a noble gas. A flow rate of the inert gas can, for example, be between 0 sccm and about 5 slm. In one example, the process gas consists of $O_2$ and Ar. Exemplary gas exposure times are between about 5 sec and about 5 min, for example about 20 sec.

A plurality of embodiments for forming a stressed gate stack for a semiconductor device has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a dielectric film on a substrate;
   depositing a metal-containing gate electrode film on the dielectric film;
   modifying a surface layer of the metal-containing gate electrode film by exposing the metal-containing gate electrode film to a process gas containing an oxygen-containing gas, a nitrogen-containing gas, or an oxygen- and nitrogen-containing gas, wherein a thickness of the modified surface layer is less than a thickness of the metal-containing gate electrode film; and
   heat-treating the modified metal-containing gate electrode film to form a stressed metal-containing gate electrode film.

2. The method of claim 1, wherein the modifying comprises:
   forming, by a slot plane antenna (SPA) plasma source, excited oxidation species, nitridation species, or oxidation and nitridation species, from the process gas in a plasma; and
   exposing the metal-containing gate electrode film to the excited oxidation species, nitridation species, or oxidation and nitridation species to incorporate oxygen, nitrogen, or oxygen and nitrogen, into the surface layer.

3. The method of claim 1, wherein the modifying comprises:
   forming, by non-ionizing electromagnetic (EM) radiation, oxygen radicals, nitrogen radicals, or oxygen and nitrogen radicals, from the process gas; and
   exposing the metal-containing gate electrode film to the oxygen radicals, the nitrogen radicals, or the oxygen and nitrogen radicals, to incorporate oxygen, nitrogen, or oxygen and nitrogen, into the surface layer.

4. The method of claim 1, wherein the modifying comprises:
   heating the substrate to a temperature between 100° C. and 600° C.; and
   exposing the metal-containing gate electrode film to the process gas to incorporate oxygen, nitrogen, or oxygen and nitrogen, into the surface layer, wherein the process gas is not excited by a plasma or by electromagnetic (EM) radiation.

5. The method of claim 1, wherein the oxygen-containing gas comprises $O_2$, $H_2O$, or $H_2O_2$, or a combination thereof, the nitrogen-containing gas comprises $N_2$, $NH_3$, $N_2H_4$, or $N_2H_6$, or a combination thereof, and the oxygen- and nitrogen-containing gas comprises NO, $N_2O$, or $NO_2$, or a combination thereof.

6. The method of claim 1, further comprising patterning the stressed metal-containing gate electrode film and the dielectric film to form a stressed gate stack that exhibits stress over the substrate.

7. The method of claim 1, wherein the dielectric film comprises $SiO_2$, SiON, $Ta_2O_5$, $TiO_2$, $ZrO_2$, $Al_2O_3$, $Y_2O_3$, $HfSiO_x$, $HfO_2$, $ZrO_2$, ZrSiOx, $TaSiO_x$, $SrO_x$, $SrSiO_x$, $LaO_x$, $LaSiO_x$, $YO_x$, or $YSiO_x$, or combinations of two or more thereof.

8. The method of claim 1, wherein the metal-containing gate electrode film comprises W, WN, Al, Mo, Ta, TaN, TaC, TaSiN, HfN, HfSiN, Ti, TiN, TiSiN, MoN, Re, or Ru, or a combination of two or more thereof.

9. The method of claim 1, wherein the thickness of the modified surface layer is between 1 nm and 5 nm and the thickness of the metal-containing gate electrode film is between 5 nm and 30 nm.

10. The method of claim 1, wherein the thickness of the modified surface layer is between 2 nm and 5 nm and the thickness of the metal-containing gate electrode film is between 4 nm and 10 nm.

11. The method of claim 1, wherein the modifying comprises:
   forming, by a slot plane antenna (SPA) plasma source, excited oxidation species, nitridation species, or oxidation and nitridation species, from a first process gas in a plasma; and
   forming the modified surface layer by exposing the metal-containing gate electrode film to the excited oxidation species, nitridation species, or oxidation and nitridation species, to incorporate oxygen, nitrogen, or oxygen and nitrogen, into the surface layer;

forming, by non-ionizing electromagnetic (EM) radiation, oxygen radicals, nitrogen radicals, or oxygen and nitrogen radicals, from a second process gas; and exposing the modified surface layer to the oxygen radicals, the nitrogen radicals, or the oxygen and nitrogen radicals, to incorporate additional oxygen, additional nitrogen, or additional oxygen and nitrogen, into the modified surface layer.

12. The method of claim 1, wherein the modifying comprises:

forming, by non-ionizing electromagnetic (EM) radiation, oxygen radicals, nitrogen radicals, or oxygen and nitrogen radicals, from a first process gas;

forming the modified surface layer by exposing the metal-containing gate electrode film to the oxygen radicals, the nitrogen radicals, or the oxygen and nitrogen radicals, to incorporate oxygen, nitrogen, or oxygen and nitrogen, into the surface layer;

forming, by a slot plane antenna (SPA) plasma source, excited oxidation species, nitridation species, or oxygen and nitrogen species from a second process gas in a plasma; and exposing the modified surface layer to the excited oxidation species, nitridation species, or oxygen and nitridation species to incorporate additional oxygen, nitrogen, or additional oxygen and nitrogen, into the modified surface layer.

13. The method of claim 1, further comprising repeating the modifying and heat-treating at least once.

14. The method of claim 1 wherein the substrate includes patterned Si fins and the resulting device comprises a FinFET or tri-gate transistor.

15. The method of claim 1, wherein the metal-containing gate electrode film is formed in a replacement gate transistor flow.

16. A method of forming a semiconductor device, comprising:

providing a dielectric film on a substrate;

depositing a metal-containing gate electrode film on the dielectric film;

modifying a surface layer of the metal-containing gate electrode film by exposing the metal-containing gate electrode film to a process gas containing an oxygen-containing gas, a nitrogen-containing gas, or an oxygen- and nitrogen-containing gas, wherein a thickness of the modified surface layer is less than a thickness of the metal-containing gate electrode film; and heat-treating the modified metal-containing gate electrode film to form a stressed metal-containing gate electrode film, wherein the substrate is maintained at a higher temperature during the heat-treating than during the modifying.

17. The method of claim 16, wherein the modifying comprises:

forming, by a slot plane antenna (SPA) plasma source, excited oxidation species, nitridation species, or oxidation and nitridation species, from the process gas in a plasma; and exposing the metal-containing gate electrode film to the a excited oxidation species, nitridation species, or oxidation and nitridation species to incorporate oxygen, nitrogen, or oxygen and nitrogen, into the surface layer.

18. The method of claim 16, wherein the modifying comprises:

forming, by non-ionizing electromagnetic (EM) radiation, oxygen radicals, nitrogen radicals, or oxygen and nitrogen radicals, from the process gas; and exposing the metal-containing gate electrode film to the oxygen radicals, the nitrogen radicals, or the oxygen and nitrogen radicals, to incorporate oxygen, nitrogen, or oxygen and nitrogen, into the surface layer.

19. The method of claim 16, wherein the modifying comprises:

heating the substrate to a temperature between 100° C. and 600° C.; and exposing the metal-containing gate electrode film to the process gas to incorporate oxygen, nitrogen, or oxygen and nitrogen, into the surface layer, wherein the process gas is not excited by a plasma or by electromagnetic (EM) radiation.

20. The method of claim 16, wherein the oxygen-containing gas comprises $O_2$, $H_2O$, or $H_2O_2$, or a combination thereof, the nitrogen-containing gas comprises $N_2$, $NH_3$, $N_2H_4$, or $N_2H_6$, or a combination thereof, and the oxygen- and nitrogen-containing gas comprises NO, $N_2O$, or $NO_2$, or a combination thereof.

21. The method of claim 16, wherein the dielectric film comprises $SiO_2$, SiON, $Ta_2O_5$, $TiO_2$, $ZrO_2$, $Al_2O_3$, $Y_2O_3$, $HfSiO_x$, $HfO_2$, $ZrO_2$, ZrSiOx, $TaSiO_x$, $SrO_x$, $SrSiO_x$, $LaO_x$, $LaSiO_x$, $YO_x$, or $YSiO_x$, or combinations of two or more thereof.

22. The method of claim 16, wherein the metal-containing gate electrode film comprises W, WN, Al, Mo, Ta, TaN, TaC, TaSiN, HfN, HfSiN, Ti, TiN, TiSiN, MoN, Re, or Ru, or a combination of two or more thereof.

23. The method of claim 16, wherein the thickness of the modified surface layer is between 1 nm and 5 nm and the thickness of the metal-containing gate electrode film is between 5 nm and 30 nm.

24. The method of claim 16 wherein the substrate includes patterned Si fins and the resulting device comprises a FinFET or tri-gate transistor.

25. The method of claim 16, wherein the metal-containing gate electrode film is formed in a replacement gate transistor flow.

* * * * *